United States Patent
Yin et al.

(10) Patent No.: US 10,826,431 B2
(45) Date of Patent: Nov. 3, 2020

(54) DIFFERENTIAL VOLTAGE-CONTROLLED (VCO) OSCILLATOR

(71) Applicant: NXP USA, INC., Austin, TX (US)

(72) Inventors: Yi Yin, Munich (DE); Baptiste Barroué, Toulouse (FR); Birama Goumballa, Larra (FR)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 16/427,455

(22) Filed: May 31, 2019

(65) Prior Publication Data

US 2019/0379326 A1    Dec. 12, 2019

(30) Foreign Application Priority Data

Jun. 6, 2018 (EP) .................................... 18305691

(51) Int. Cl.
*H03B 5/12*    (2006.01)

(52) U.S. Cl.
CPC ........... *H03B 5/124* (2013.01); *H03B 5/1212* (2013.01); *H03B 5/1215* (2013.01); *H03B 5/1228* (2013.01); *H03B 5/1231* (2013.01); *H03B 5/1253* (2013.01); *H03B 5/1256* (2013.01); *H03B 5/1265* (2013.01); *H03B 5/1296* (2013.01)

(58) Field of Classification Search
CPC ........ H03B 5/12; H03B 5/124; H03B 5/1228; H03B 5/1215; H03B 5/1253; H03B 5/1256; H03B 5/1296; H03B 5/1265; H03B 5/1293; H03B 5/1212
USPC ................................ 331/167, 117 FE, 177 V
See application file for complete search history.

(56) References Cited

U.S. PATENT DOCUMENTS

| | | | |
|---|---|---|---|
| 6,946,924 B2 | 9/2005 | Chominski | |
| 7,061,340 B2* | 6/2006 | Boccuzzi | H03B 5/1228 331/117 FE |
| 7,154,349 B2 | 12/2006 | Cabanillas | |
| 8,489,054 B2 | 7/2013 | Sapone et al. | |
| 2004/0196110 A1 | 10/2004 | Boccuzzi et al. | |
| 2008/0106343 A1 | 5/2008 | Jang et al. | |
| 2008/0174378 A1* | 7/2008 | Cusmai | H03B 27/00 331/167 |
| 2010/0123536 A1 | 5/2010 | Lu et al. | |
| 2011/0043401 A1 | 2/2011 | Li | |

OTHER PUBLICATIONS

Padovan, F., "A K-band SiGe Bipolar VCO with Transformer-Coupled Varactor for Backhaul Links", IEEE 13th Topical Meeting on Silicon Monolithic Integrated Circuits in RF Systems, 2013.
Zirath, H., "MMIC-Oscillator Designs for Ultra Low Phase Noise", IEEE Compound Semiconductor Integrated Circuit Symposium, 2005.

* cited by examiner

*Primary Examiner* — Arnold M Kinkead

(57) ABSTRACT

The present application relates to a differential Colpitts voltage-controlled oscillator (VCO) circuit, which comprises a pair of transistors with control terminals biased by a common biasing voltage and a pair of couplers arranged to cross-couple corrector/drain of the transistors and the base/gate of the differential transistors. The pair of couplers have a coupling factor $k_c$, which used to enhance the transconductance of the transistor pair, therefore can be used for power consumption reduction and phase noise minimalization.

20 Claims, 3 Drawing Sheets

DIFFERENTIAL VOLTAGE-CONTROLLED (VCO) OSCILLATOR

CROSS-REFERENCE TO RELATED APPLICATIONS

This application claims the priority under 35 U.S.C. § 119 of European Patent application no. 18305691.0, filed on 6 Jun. 2018, the contents of which are incorporated by reference herein.

FIELD OF THE INVENTION

The present disclosure relates generally to a differential voltage-controlled (VCO) oscillator. In particular, the present disclosure relates to a differential VCO with Colpitts configuration.

BACKGROUND

The development of millimeter-wave silicon technology has been driven in the last years by automotive driver assistance systems (ADASs) for safety and security, which has been developed to a fast-developing market. Main aspects of ADASs relate to accuracy of ultra-wideband (UWB)/frequency-modulated continuous-wave (FMCW) radar circuits and implementability in form of silicon fully integrated solutions in the W-band (75 GHz to 110 GHz). A complete ADAS equipment typically includes 77-81 GHz short-range radar (SRR) UWB sensors aiming at e.g. parking aid, blind-spots detection, and collision mitigation assistance and 76-77 GHz long-range radar (LRR) sensors with FMCW modulation aiming at e.g. front-monitoring and adaptive cruise control (ACC).

To comply with both SRR and LRR, the frequency synthesizer adopted in such systems must provide a clock reference with a wide frequency range for the former, whereas spectral purity and large output power toward the power amplifier (PA) are mandatory for the latter application. In a voltage-controlled oscillator (VCO)-based frequency synthesizer, the power and in-band noise performance rely on the VCO circuit, which represents a crucial block of the frequency synthesizer together with high-frequency dividers (i.e., prescaler). Despite of the past development, the implementation of a W-band VCO with low phase noise (PN) and wide tuning range (TR) in combination with a high output power oscillation signal is still challenging.

SUMMARY

The present invention provides a differential voltage-controlled oscillator circuit as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Figure 1:
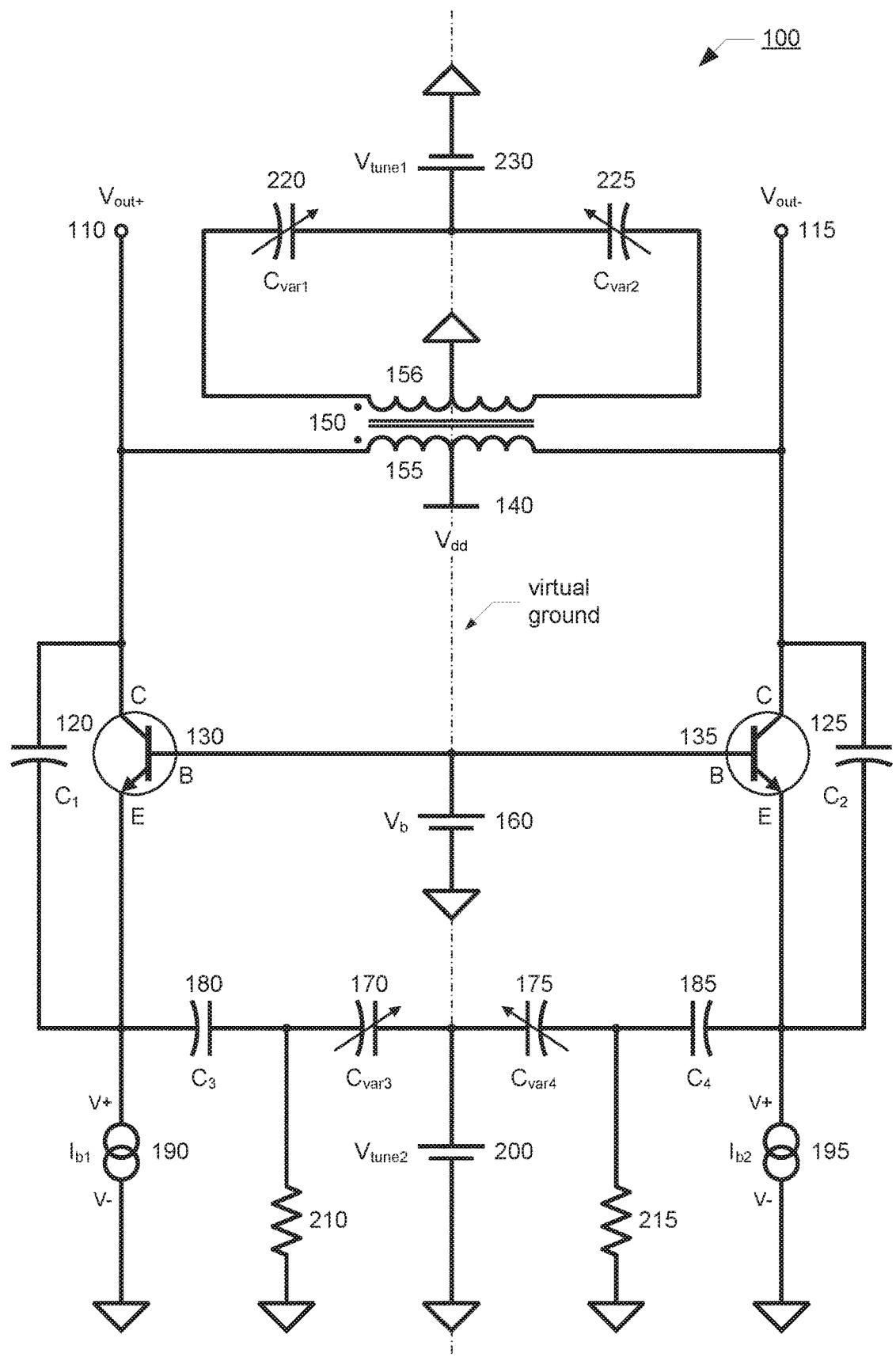
FIG. 1 schematically illustrates a circuit diagram for showing the configuration of a differential oscillator according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

With reference to FIG. 1, a schematic circuit diagram for showing a configuration of a differential oscillator according to an example of the present invention is illustrated. The differential oscillator 100 is a common-base Colpitts oscillator and takes the form of a differential oscillator circuit with positive and negative output terminals $V_{out+}$ 110 and $V_{out-}$ 115. It should be noted that in the context of this specification, a differential signal may comprise two components having the same amplitude and opposite phase. A differential signal may be provided via two terminals.

The differential oscillator comprises two active devices, in this case first transistor 130 and second transistor 135. Any kind of transistor or suitable active device may be used. The active devices respectively transistors 130 and 135 may be identical in respect to their properties to provide symmetrical active devices. In particular, the two active devices are bipolar transistors 130 and 135; more particularly, the two active devices are bipolar junction transistors 130 and 135. It may be contemplated to use transistors suitable for high frequencies for or as active devices, in particular NPN-transistors.

In the illustrated configuration, the bipolar transistors 130 and 135 form a balanced differential pair of bipolar transistors 130 and 135. The bases of transistor 130 and 135 may be connected to a biasing voltage $V_{bias}$. The biasing voltage $V_{bias}$ may be a direct (DC) biasing voltage $V_{bias}$, which may be referred to as common mode DC biasing voltage $V_{bias}$. The biasing voltage $V_{bias}$ may be provided by a biasing voltage source 160 coupled between the bases of the transistors 130 and 135 and a lowest reference potential such as ground. The biasing voltage $V_{bias}$ may be chosen in any suitable way to bias the base voltages of the transistors 130 and 135. In the illustrated example, the bases of the transistors 130 and 135 are coupled to each other and the basing voltage $V_{bias}$ is applied to the interconnected bases of the transistors 130 and 135.

Capacitors 120 and 125 are coupled in parallel to the collector-emitter path of transistors 130 and 135. The capacitor 120 and the capacitor 125 form positive feedback capacitors, each of which being connected to the collector and the emitter of a respective one of the transistors 130 and 135. The capacitors 120 and 125 provide a positive feedback from the emitter to the collector of the respective one of the transistors 130 and 135. It is feasible to choose the capacitances of capacitors 120 and 125 to be equal.

A coil 155 biased at a supply voltage $V_{dd}$ 140 is coupled to the collectors of the transistors 130 and 135 such that the collectors of the transistors 130 and 135 are coupled to each other via the coil 155. The collectors of the transistors 130 and 135 are coupled to a respective one of the end taps of the coil 155. In an example, a supply voltage $V_{dd}$ 140 is supplied to the coil 155; in particular the supply voltage $V_{dd}$ 140 is supplied to a center tap of the coil 155. For instance, the supply voltage $V_{dd}$ may be 2.5 V, or lower, or higher (e.g. 3.3 V or 5 V).

The emitters of the transistors 130 and 135 are further coupled to each other via varactors 170 and 175. The capacitances of the varactors 170 and 175 are tunable by a tuning voltage $V_{tune2}$ provided by a tuning voltage source 200 to supply an interconnection common net of the varactors 170 and 175. The tuning voltage $V_{tune2}$ is a direct voltage source or a current mirrored voltage e.g. provided by a current mirror circuit. It is feasible to choose the capacitances of varactors 170 and 175 to be equal. The varactors 170 and 175 may have an essentially identical capacitance dependency to a changing tuning voltage $V_{tune2}$ over a suitable tuning voltage range. In the illustrated configuration, the varactors 170 and 175 are coupled in series between the emitters of the transistors 130 and 135. The capacitance tuning of the varactors 170 and 175 is obtained by a single-ended tuning voltage $V_{tune2}$ control.

In order to enable the tuning voltage $V_{tune2}$ to tune the varactor capacitors 170 and 175 starting from zero voltage (unbiased), in an example, further capacitors 180 and 185 are inserted between the respective one of the emitters of the transistors 130 and 135 and the respective one of the varactors 170 and 175. It is feasible to choose the capacitances of capacitors 180 and 185 to be equal. The potential of the interconnections between the respective one of the capacitors 180 and 185 and the respective one of the varactors are set via a respective one of resistors 210 and 215 to a lowest reference potential such as ground. The AC-coupling approach for the oscillation signal through the capacitors 180 and 185 and the biasing resistors 210 and 215 and for biasing take advantage of the whole positive tuning characteristic of the varactors 170 and 175.

In the differential oscillator, a bias current source 190 provides a bias current $I_{b1}$ for the transistor 130 and a bias current source 195 provides a bias current $I_{b2}$ for the transistor 135, respectively. The bias current sources 190 and 195 may provide direct bias current $I_{b1}$ and direct bias current $I_{b2}$, respectively. In an example, the bias current sources 190 and 195 are inserted between a respective one of the emitters of the transistor 130 and 135 and a lowest reference potential such as ground. The bias current sources 190 and 195 may provide essentially the same bias current $I_b$ ($=I_{b1}=I_{b2}$) for the transistor 130 and 135.

The positive and negative output terminals $V_{out+}$ 110 and $V_{out-}$ 115 are coupled to the collectors of the respective one of the transistors 130 and 135.

The coil 155 is a first or primary coil of a transformer 150 comprising a second or secondary coil 156 inductively coupled with the coil 155. The second coil 156 is coupled in series to varactors 220 and 225, which capacitances are tunable by a tuning voltage $V_{tune1}$ provided by a tuning voltage source 230 to the common interconnection net of the varactors 220 and 225. The tuning voltage $V_{tune1}$ is a direct voltage source or a current mirrored voltage e.g. provided by a current mirror circuit. The capacitance tuning of the varactors 220 and 225 is enabled by a single-ended tuning voltage $V_{tune1}$ control. It is feasible to choose the capacitances of varactors 220 and 225 to be equal. The varactors 220 and 225 may change the capacitance dependency to a changing tuning voltage $V_{tune1}$ over a suitable tuning voltage range. In the illustrated configuration, the varactors 220 and 225 are connected in series between a respective one of the end taps of the second coil 156. The center tap of the second coil 156 is applied to a reference potential, and in particular, the center tap of the second coil 156 is set to lowest reference potential such as ground, in order to achieve a maximal tuning range within a given supply.

The main frequency tuning of the differential oscillator is enabled by the transformer coupled varactor pair 220 and 225. The transformer coupled pair of varactors 220 and 225 enables a tuning of the oscillator frequency in the W-band. In particular, the transformer coupled pair of varactors 220 and 225 enables a tuning of the oscillator frequency in a frequency range, which comprises the LRR frequency range (76-77 GHz) and the SRR frequency range (77-81 GHz). The frequency tuning range of the differential oscillator is further expanded by the emitter side arranged varactor pair 170 and 175, which enables not only a wide tuning range for e.g. LRR and SRR application, but also in particular compensation of the oscillation frequency drift due to process, supply and temperature variation (PVT).

With respect to FIG. 1, an example of a differential oscillator is illustrated and described, which comprises bipolar transistors 130 and 135 as active devices. In particular, SiGe bipolar transistors 130 and 135 may offer desired high frequency characteristics. However, the implementation of a differential oscillator should not be understood to be limited to bipolar transistors 130 and 135 as active devices. MOS (n-type metal-oxide semiconductor) transistors and in particular NMOS (n-type metal-oxide semiconductor) transistors may be also used as active devices.

Figure 2:
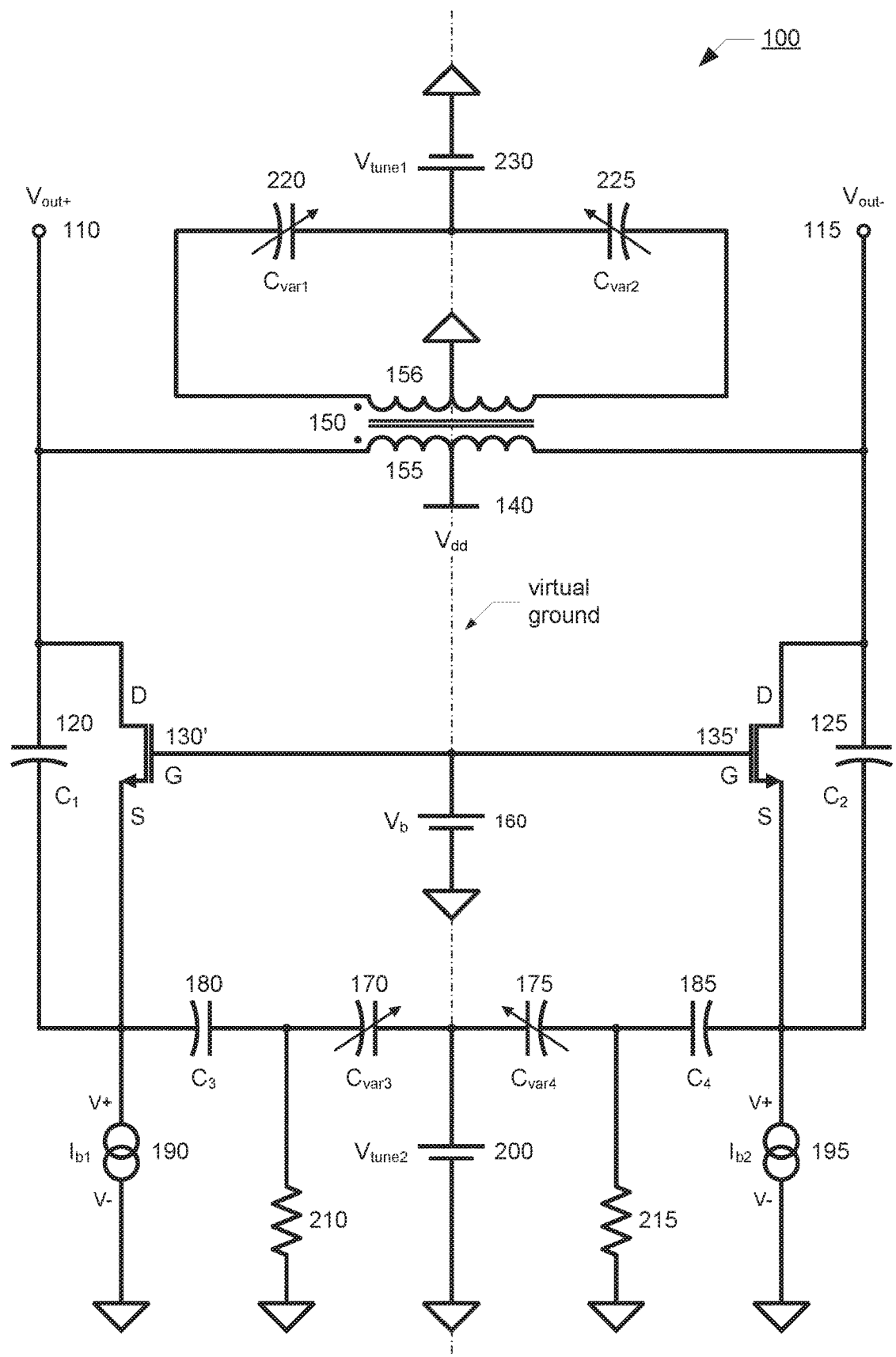
FIG. 2 schematically illustrates a circuit diagram for showing the configuration of a differential oscillator according to another example of the present invention.

Referring now to FIG. 2, a schematic circuit diagram for showing another configuration of a differential oscillator according to an example of the present invention is illustrated. The active devices respectively transistors 130 and 135, which may be identical in respect to their properties to provide symmetrical active devices, are MOS transistors 130' and 135'; more particularly, the two active devices are NMOS transistors 130' and 135' in a balanced configuration. The remaining circuit substantially corresponds to that describes with reference to FIG. 1. Hence, the above description essentially applies likewise to the configuration of FIG. 2 provided that the technical terms relating to the terminals of the bipolar transistors 130 and 135 are translated into technical terms relating to the terminals of the MOS transistors 130' and 135'. Those skilled in the art will immediately understand that the terms "collector", "emitter" and "base" used in the context of bipolar transistors translate to the corresponding terms "drain", "source" and "gate" for MOS transistors. Hence, a repetition is omitted.

For the sake of description, the collector terminal and the drain terminal will be also referred to as a first current terminal, the emitter terminal and drain terminal will be also referred to as a second current terminal and the base terminal and gate terminal will be also referred to as a control terminal.

Figure 3:
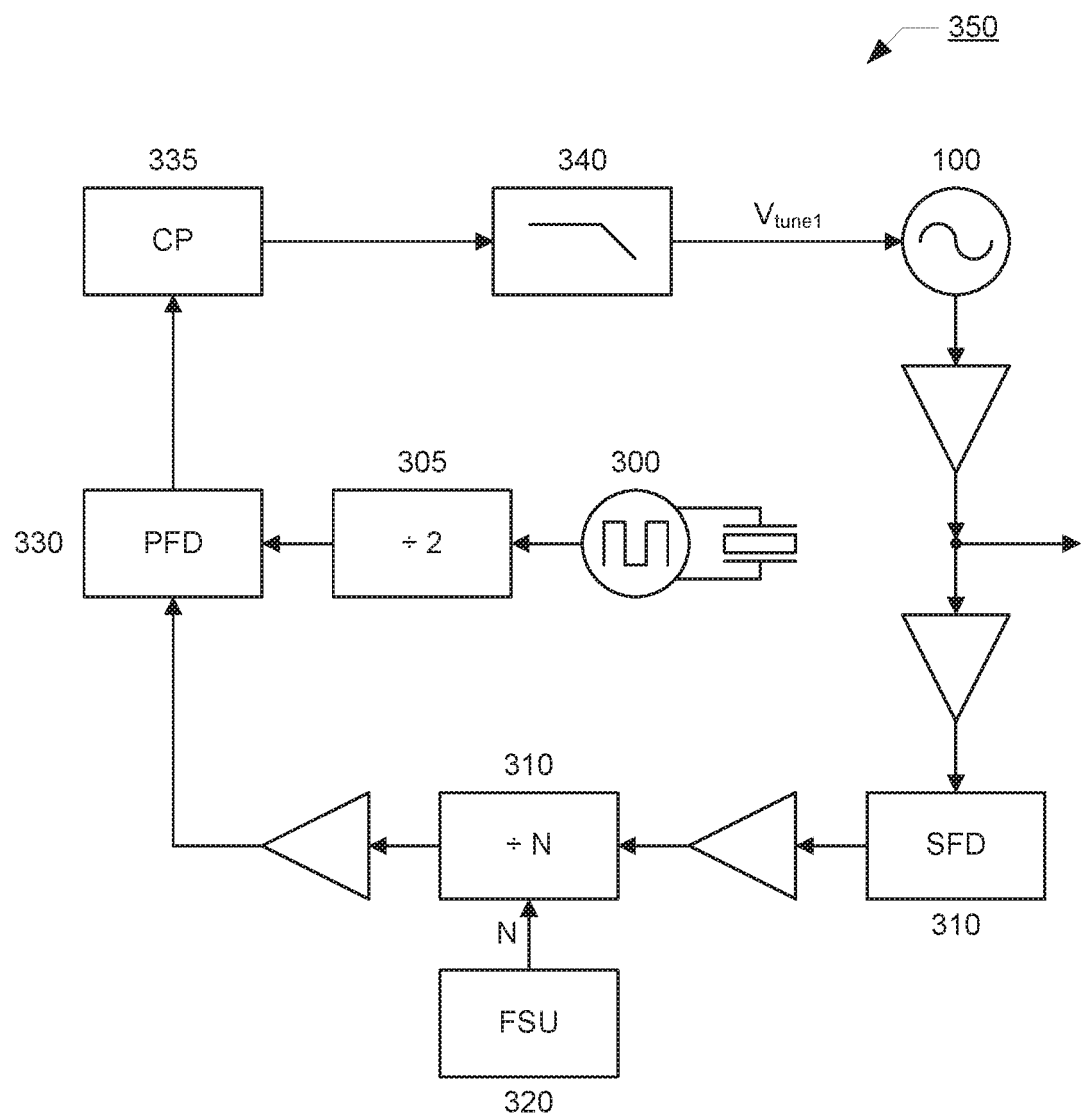
FIG. 3 schematically illustrates a circuit diagram of a PLL synthesizers according to another example of the present invention.

With respect to FIG. 3, a schematic circuit diagram of a PLL synthesizer according to another example of the present invention is illustrated. The illustrated PLL synthesizer should be understood to represent a use case of the above described differential VCO, but the present application should not be understood to be limited thereto.

The PLL synthesizer comprises a divider chain receiving the output signal of the differential VCO 100. The divider chain may comprise a static frequency divider, SFD, 310 and a programmable divider 310. The programmable divider may receive control information in form of a frequency control word from a frequency selection logic, FSL. The output of the divider chain is supplied to a phase and frequency detector, PFD, 330, which further receives a reference input signal, e.g. from a master oscillator, 300, and a downstream arranged fixed frequency divider, 305. The phase and frequency difference generated by the phase and frequency detector, PFD, 330 is supplied to a charge pump, CP, 335 and a filter 340, which finally generate the tuning voltage signal $V_{tune1}$ for being supplied to the differential voltage oscillator 100.

According to an example of the present application, a differential oscillator circuit is provided. The differential oscillator circuit comprises a pair of transistors with control terminals biased by a common biasing voltage. The differential oscillator circuit further comprises a transformer having a primary coil coupled between first current terminals of the transistors and a secondary coil coupled in a closed series circuit with two varactors, which are arranged for being tuned by a first common tuning voltage. The differential oscillator circuit further comprises a series circuit comprising two further varactors coupled in series to second current terminals of the transistors. The two further varactors are arranged for being tuned by a second common tuning voltage.

According to an example, the differential oscillator circuit further comprises feedback capacitors. Each of the feedback capacitors is coupled between the first and second current terminals of a respective one of the transistors.

According to an example, the differential oscillator circuit further comprises bias current sources. Each of the bias current sources is inserted between the second current terminals of a respective one of the transistors and a reference potential (e.g. a lowest reference potential or ground). The bias current sources may supply direct currents, and in particular, the bias current sources may supply the same direct current to the second current terminals of a respective one of the transistors.

According to an example, the transistors form a balanced differential pair.

According to an example, the primary coil has a center tap, which is arranged to receive a supply voltage. According to an example, the secondary coil has a center tap, which is arranged receive the reference potential (e.g. a lowest reference potential or ground).

According to an example, the transistors are bipolar transistors. The first current terminal is a collector terminal, the second current terminal is an emitter terminal, and the control terminal is a base terminal. According to an example, the transistors are bipolar transistors and in particular npn-transistors.

According to an example, the transistors are metal-oxide semiconductor (MOS) transistors and in particular MOSFETs (metal-oxide semiconductor field effect transistors). The first current terminal is a drain terminal, the second current terminal is a source terminal, and the control terminal is a gate terminal. According to an example, the transistors are n-channel MOS transistors and n-channel MOSFETs.

According to an example, the differential oscillator circuit further comprises two capacitors. Each of the two capacitors is coupled in series between the second current terminals of a respective one of the transistors and a respective one of the two further varactors.

According to an example, the differential oscillator circuit further comprises two resistors. Each of the two resistors is coupled to an interconnection between a respective one of the two capacitors and an adjacent one of the two further varactors and reference potential (e.g. a lowest reference potential or ground).

According to an example, the differential oscillator circuit further comprises a biasing voltage source coupled to an interconnection of the control terminals of the transistors and arranged to supply the common biasing voltage. The biasing voltage source is arranged to supply a common mode DC biasing voltage.

According to an example, the differential oscillator circuit further comprises a first tuning voltage source coupled to an interconnection of the two varactors and arranged to supply the first common tuning voltage. The first tuning voltage source is arranged to supply a first common DC tuning voltage.

According to an example, the differential oscillator circuit further comprises a second tuning voltage source coupled to an interconnection of the two further varactors and arranged to supply the second common tuning voltage. The second tuning voltage source is arranged to supply a second common DC tuning voltage.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections or couplings as discussed herein may be any type of connection or coupling suitable to transfer signals from or to the respective nodes, units or devices, for example via intermediate devices. The terms coupling and connection, respectively coupled and connected, may be used interchangeably. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as differential: positive or negative analog signal. In the case of a negative analog signal, the signal is relative lower than the common-mode DC signal, which corresponds to an analog ground level zero. In the case of a positive signal, the signal is higher than the common-mode DC signal, which corresponds to an analog ground. Note that any of the differential signals described herein can be designed as either negative or positive signals.

Those skilled in the art will recognize that the boundaries between functional blocks are merely illustrative and that alternative embodiments may merge functional blocks or circuit elements or impose an alternate decomposition of functionality upon various blocks or circuit elements. Thus, it is to be understood that the architectures depicted herein are merely exemplary, and that in fact many other architectures can be implemented which achieve the same functionality. For example, an inductive coil and a resistor may be integrated into one element.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the illustrated examples may be implemented as circuitry located on a single integrated circuit or within a same device, in an embodiment. For example, all the components of the oscillator circuit may be integrated on one substrate. Alternatively, the examples may be implemented as any number of separate integrated circuits or separate devices interconnected with each other in a suitable manner. For example, one or more than one of the output branches may be provided partially or completely on a substrate different from the substrate the oscillator core is provided on.

Also, the examples, the embodiments, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A differential oscillator circuit comprising:
   a pair of transistors with control terminals biased by a common biasing voltage;
   a transformer having a primary coil coupled between first current terminals of the transistors and a secondary coil coupled in a closed series circuit with two varactors, which are arranged for being tuned by a first common tuning voltage;
   feedback capacitors, each of which coupled between the first and second current terminals of a respective one of the transistors; and
   a series circuit comprising two further varactors coupled in series to second current terminals of the transistors, wherein the two further varactors are arranged for being tuned by a second common tuning voltage.

2. The circuit according to claim 1, further comprising:
   bias current sources, each of which inserted between the second current terminals of a respective one of the transistors and a reference potential.

3. The circuit according to claim 1, wherein the transistors form a balanced differential pair.

4. The circuit according to claim 1, wherein the primary coil has a center tap, which is arranged to receive a supply voltage.

5. The circuit according to claim 1, wherein the secondary coil has a center tap, which is supplied to a reference potential.

6. The circuit according to claim 1, wherein the transistors are bipolar transistors, wherein the first current terminal is a collector terminal, the second current terminal is an emitter terminal and the control terminal is a base terminal.

7. The circuit according to claim 6, wherein the transistors are npn-transistors.

8. The circuit according to claim 1, wherein the transistors are metal-oxide semiconductor, MOS, transistors, wherein the first current terminal is a drain terminal, the second current terminal is a source terminal and the control terminal is a gate terminal.

9. The circuit according to claim 8, wherein the transistors are n-channel MOS transistors.

10. The circuit according to claim 1, further comprising:
    two capacitors, each of which coupled in series between the second current terminals of a respective one of the transistors and a respective one of the two further varactors.

11. The circuit according to claim 10, further comprising:
    two resistors, each of which coupled to an interconnection between a respective one of the two capacitors and an adjacent one of the two further varactors and base reference potential.

12. The circuit according claim 1, further comprising:
a biasing voltage source coupled to an interconnection of the control terminals of the transistors and arranged to supply the common biasing voltage.

13. The circuit according to claim 1, further comprising:
a first tuning voltage source coupled to an interconnection of the two varactors and arranged to supply the first common tuning voltage.

14. The circuit according to claim 1, further comprising:
a second tuning voltage source coupled to an interconnection of the two further varactors and arranged to supply the second common tuning voltage.

15. A differential oscillator circuit comprising:
a first bipolar transistor having a control electrode coupled to receive a first bias voltage;
a second bipolar transistor having a control electrode coupled to receive the first bias voltage;
a transformer having a primary coil coupled between first current electrodes of the first and second bipolar transistors and a secondary coil coupled in a closed series circuit with a first varactor and a second varactor, each of the first varactor and the second varactor is configured and arranged for being tuned by a first common tuning voltage;
a series circuit comprising a third varactor and a fourth varactor coupled in series to second current electrodes of the first and second bipolar transistors, each of the third varactor and the fourth varactor is configured and arranged for being tuned by a second common tuning voltage;
a first feedback capacitor having a first terminal coupled to the first current electrode of the first bipolar transistor and a second terminal coupled to the second current electrode of the first bipolar transistor; and
a second feedback capacitor having a first terminal coupled to the first current electrode of the second bipolar transistor and a second terminal coupled to the second current electrode of the second bipolar transistor.

16. The circuit of claim 15, wherein the primary coil includes a center tap configured and arranged to receive a supply voltage.

17. The circuit of claim 15, further comprising:
a first bias current source having a first terminal coupled to the second current electrode of the first bipolar transistor and a second terminal coupled to a reference potential; and
a second bias current source having a first terminal coupled to the second current electrode of the second bipolar transistor and a second terminal coupled to the reference potential.

18. The circuit of claim 17, wherein the secondary coil includes a center tap configured and arranged to receive the reference potential.

19. A differential oscillator circuit comprising:
a pair of transistors with control terminals biased by a common biasing voltage;
a transformer having a primary coil coupled between first current terminals of the transistors and a secondary coil coupled in a closed series circuit with two varactors, which are arranged for being tuned by a first common tuning voltage, the primary coil having a center tap arranged to receive a supply voltage; and
a series circuit comprising two further varactors coupled in series to second current terminals of the transistors, wherein the two further varactors are arranged for being tuned by a second common tuning voltage.

20. A differential oscillator circuit comprising:
a first bipolar transistor having a control electrode coupled to receive a first bias voltage;
a second bipolar transistor having a control electrode coupled to receive the first bias voltage;
a transformer having a primary coil coupled between first current electrodes of the first and second bipolar transistors and a secondary coil coupled in a closed series circuit with a first varactor and a second varactor, each of the first varactor and the second varactor is configured and arranged for being tuned by a first common tuning voltage;
a series circuit comprising a third varactor and a fourth varactor coupled in series to second current electrodes of the first and second bipolar transistors, each of the third varactor and the fourth varactor is configured and arranged for being tuned by a second common tuning voltage;
a first bias current source having a first terminal coupled to the second current electrode of the first bipolar transistor and a second terminal coupled to a reference potential; and
a second bias current source having a first terminal coupled to the second current electrode of the second bipolar transistor and a second terminal coupled to the reference potential.

* * * * *